United States Patent [19]

Csicsatka et al.

[11] 3,931,576

[45] Jan. 6, 1976

[54] AUTOMATIC GAIN CONTROL CIRCUIT FOR RADIO RECEIVER

[75] Inventors: Antal Csicsatka, Utica; Leslie H. String, Johnstown, both of N.Y.

[73] Assignee: General Electric Company, Syracuse, N.Y.

[22] Filed: Jan. 14, 1975

[21] Appl. No.: 540,814

[52] U.S. Cl. ......... 325/409; 178/DIG. 19; 325/319; 325/413; 325/427; 328/175; 330/145
[51] Int. Cl.² ...................... H04B 1/16; H03G 5/28
[58] Field of Search .......... 325/319, 400, 408, 409, 325/411–415, 427, 485, 489; 178/DIG. 19; 358/38; 328/175; 330/87, 145

[56] References Cited
UNITED STATES PATENTS

| | | |
|---|---|---|
| 2,858,423 | 10/1958 | Stern .................................. 325/411 |
| 2,947,859 | 8/1960 | MacDonald ......................... 325/411 |
| 3,012,137 | 12/1961 | Riceman ............................. 325/408 |
| 3,495,031 | 2/1970 | Poppa ............................... 178/5.8 R |
| 3,852,522 | 12/1974 | Martin ............................. 178/5.8 R |
| 3,872,387 | 3/1975 | Banach ............................. 325/427 |

*Primary Examiner*—George H. Libman
*Assistant Examiner*—Marc E. Bookbinder

[57] ABSTRACT

An intermediate frequency amplifier stage includes a tuned circuit which is shunted by a transistor utilized as an emitter follower, the emitter follower being responsive to the amplitude of a detected signal to lower the "Q" of the tuned circuit as the amplitude of the detected signal increases and to increase the "Q" of the tuned circuit as the amplitude of the detected signal decreases, thus effecting the gain of the intermediate frequency amplifier stage inversely respective the amplitude of the detected signal.

2 Claims, 1 Drawing Figure

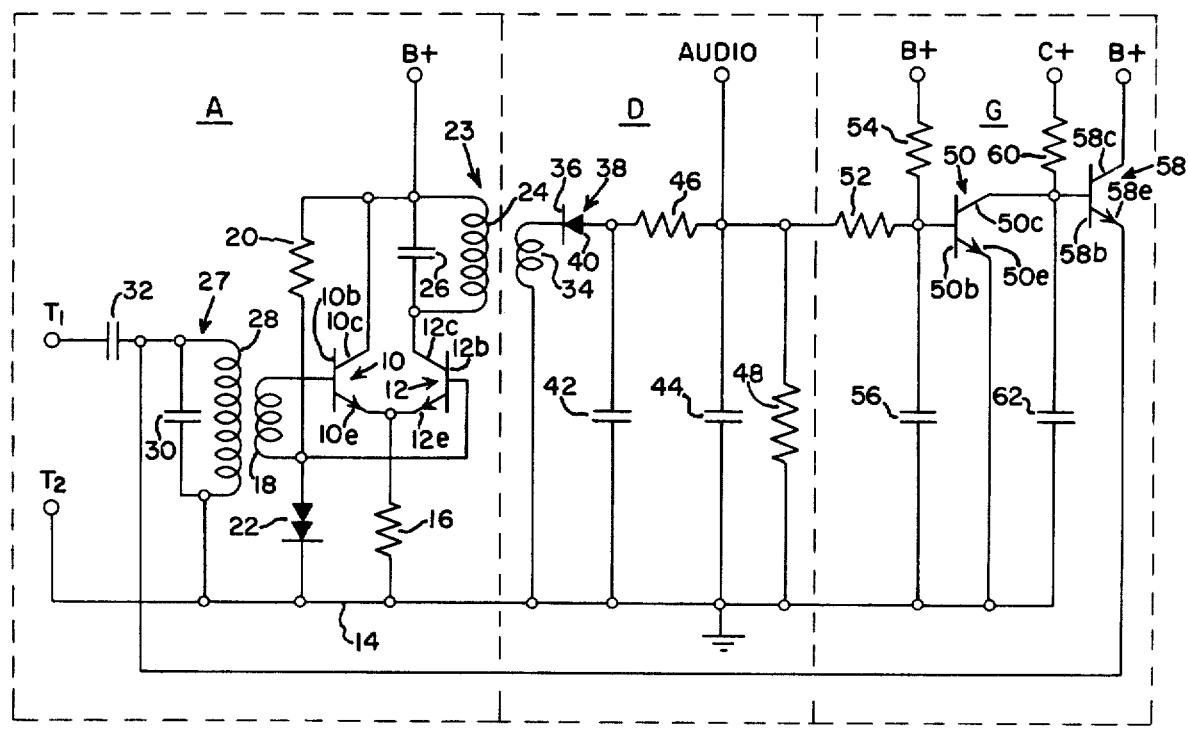

AUTOMATIC GAIN CONTROL CIRCUIT FOR RADIO RECEIVER

INTRODUCTION

This invention relates to an improved automatic gain control circuit as utilized in radio receivers, and more particularly to a circuit wherein an intermediate frequency amplifier tank circuit is loaded by a variable impedance element in shunt with the tank circuit to control the gain of an intermediate frequency amplifier responsive to an incoming signal being processed by the radio receiver.

BACKGROUND OF THE INVENTION

Automatic gain control circuits as utilized in radio receivers are well known in the art, and in general are circuits utilized to automatically vary the amplification of a signal being processed by the receiver in accordance with the changing strength or intensity of the signal at the input to the receiver to provide a substantially constant output power for large variations of signal strength at the input to the receiver. The automatic gain control circuit, in one aspect, consists of a means for taking, at the detector of the receiver, a voltage proportional to the strength of the incoming carrier signal being processed by a receiver and applying the same as a bias to an intermediate frequency amplifier of the receiver to reduce the gain of the intermediate frequency amplifier as the voltage proportional to the incoming signal being processed increases. In another aspect, the "Q" of a portion of the circuit in an intermediate frequency amplifier of a receiver may be varied by utilizing the voltage proportional to the incoming carrier signal being processed by the receiver to vary the Q of the particular circuit.

Typical prior art automatic gain control circuits utilized components such as electrolytic capacitors and ceramic capacitors which types of capacitors are not suitably fabricated by state of the art integrated circuitry. In the aforementioned prior art circuits, the direct current component of a detected intermediate frequency signal, representative of the radio frequency strength of the incoming signal, is utilized to control the collector current of the intermediate frequency amplifier, which reacts with an overload diode to lower or increase the Q of a tuned circuit in the intermediate frequency amplifier. Lowering of the Q of the tuned circuit in the intermediate frequency amplifier by the prior art leads to degradation of the received signal.

BRIEF DESCRIPTION OF THE INVENTION

The present invention is generally associated with and presents a new and improved circuit for automatic gain control in a receiver wherein the circuit provides a variable impedance in shunt with a parallel tuned resonant circuit of one of the intermediate frequency amplification stages of the receiver. A parallel tuned circuit or tank circuit of the intermediate frequency amplification stage is loaded by means of an emitter follower output, which emitter follower output provides a variable impedance across the parallel tuned circuit by processing a signal at the receiver detector stage in a manner to effect variation in the Q of the parallel tuned circuit and accomplish the desired automatic gain control effect.

In carrying out the present invention, a tank circuit of an intermediate frequency coupling transformer is shunted by the output impedance of an emitter follower circuit. The emitter follower is responsive to the presence of a direct current bias controlled by the detector of the receiver, said emitter follower presenting a high impedance across the tank circuit of the intermediate frequency coupling transformer in the absence of a detected signal, and a lower impedance inversely as the strength of a carrier detection of the signal.

A more detailed description of the invention may be obtained by reference to the specification when taken with the drawing wherein the FIGURE is a circuit diagram of a portion of an AM radio receiver embodying the invention.

DETAILED DESCRIPTION OF THE INVENTION

Referring more particularly to the FIGURE of the drawing, there is shown a portion of a complete radio comprising an intermediate frequency amplifier stage "A", a detector "D" and an automatic gain control circuit "G". The active components of intermediate frequency amplifier A comprise a first semiconductor 10 having a base 10$b$, a collector 10$c$ and an emitter 10$e$, and a second semiconductor 12 having a base 12$b$, a collector 12$c$ and an emitter 12$e$. The illustrative circuitry of intermediate frequency amplifier A includes the common connection of emitters 10$e$ and 12$e$ to a potential reference line or ground line 14 through a resistor 16. Base 10$b$ and base 12$b$ are each connected to one of the opposing ends of an inductance 18. Base 12$b$ is further connected to a means for applying a source of B+ potential through a resistor 20 and to ground line 14 through a diode array 22. Collector 10$c$ is connected directly to the means for applying a source of B+ potential, and collector 12$c$ is connected to the same means for applying a source of B+ potential through a parallel tuned circuit 23 comprising inductor 24 and capacitor 26.

Input to the intermediate frequency amplifier A is provided between terminals T$_1$ and T$_2$ and coupled to a parallel tuned circuit 27 comprising an inductance 28 and capacitor 30 by means of a coupling capacitor 32 connected between a first end of the parallel tuned circuit 27 and terminal T$_1$ and by connecting the other end of the parallel tuned circuit 27 to ground line 14.

Output from the intermediate frequency amplifier A is obtained by inductively coupling inductor 34, here shown as part of detector D, to inductor 24. One end of inductor 34 is connected to ground line 14 with the other end connected to one element, the cathode 36 of detector diode 38. The other element of detector diode 38, the anode 40, is connected to a filter network for obtaining the desired audio output, and obtaining a direct current voltage component representative of the radio frequency signal strength of signal being processed by the diode detector 38.

The filter network comprises capacitors 42 and 44, respectively, and resistors 46 and 48. Capacitor 42 is connected between anode 40 and ground line 14. Resistors 46 and 48 are also serially connected between anode 40 and ground line 14. Capacitor 44 is connected between the common junction of resistors 46 and 48 and ground line 14. Audio output as well as an automatic gain control signal is developed at the common junction of resistors 46 and 48.

The automatic gain control circuit in box G includes a first transistor 50 having a base 50$b$, a collector 50$c$ and an emitter 50$e$, and wherein the automatic gain control signal is applied from the common junction of resistors 46 and 48 through a resistor 52 to the base 50b of transistor 50 as well as to the common junction of a serially connected resistor 54 and capacitor 56. The resistor 54 is connected at its remaining end to the positive source of a supply designated B+ and the capacitor 56 is connected at its remaining end to the ground line 14. The emitter 50e of transistor 50 is connected to ground line 14.

A second transistor 58 having a base 58b, a collector 58c and an emitter 58e also forms part of the automatic gain control circuit, and has base 58b connected to the collector 50c of transistor 50. Bias from a source denominated C+ is applied to the common junction of collector 50c and base 58b through a resistor 60, and the common junction is further connected to ground line 14 through a capacitor 62. The collector 58c of transistor 58 is connected to a source of supply B+ and the emitter 58e of transistor 58 is connected to the common junction of capacitor 32 and tuned parallel circuit 27.

In operation, absent a signal input between terminals $T_1$ and $T_2$ and with the proper bias applied to diode 38 and transistor 50 through choice of values for resistors 46, 48, 52 and 54, as is well known in the art, transistor 50, which acts to amplify signals representative of the amplitude of the carrier of a detected signal, is in a saturated condition and the emitter follower transistor 58, which acts as a shunt across tuned circuit 27, has no substantial shunt effect on said tuned circuit 27.

In the presence of a signal applied between terminals $T_1$ and $T_2$, a voltage is developed at the detector in a direction to cause the base current of transistor 50 to decrease and thereby cause an increase in the voltage appearing at base 58b of transistor 58, causing said transistor 58 to turn on. As transistor 58 becomes more conductive, the shunt effect across tuned circuit 27 becomes more pronounced, lowering the Q of circuit 27 and decreasing the effective amplification of the amplifier A. The greater the amplitude of the signal applied between terminals $T_1$ and $T_2$, the greater the shunt effect provided by transistor 58 across the tuned circuit 27, thus obtaining the object of automatic gain control of amplifier A.

The present invention has been described with particular reference to the accompanying drawing but it should be obvious that other and further modifications apart from that shown and suggested within the above specification may be made within the spirit and scope of this invention as defined in the appended claims.

What is new and novel and desired to be secured by Letters Patent of the United States is:

1. A radio receiving apparatus including an intermediate frequency amplifier stage and a detector stage coupled to said amplifier stage and means for varying the gain of said intermediate frequency amplifier stage inversely respective the amplitude of a carrier wave being processed through said intermediate frequency amplifier stage and said detector, said intermediate frequency amplifier including a tuned circuit, and said detector including means for developing a voltage proportional to the amplitude of a carrier wave being processed by said detector, and said means for varying the gain of said intermediate frequency amplifier including a first transistor in a normally saturated conductivity condition in the absence of a processed carrier wave and coupled to said detector for receiving said detector developed voltage to decrease the conductivity of said first transistor in the presence of a processed carrier wave, a second transistor connected in an emitter follower circuit configuration including an emitter follower output and coupled to the output of said first transistor, said second transistor being non-conductive during the saturated condition of said first transistor and becoming increasingly conductive as the conductivity of said first transistor decreases, said emitter follower output being connected to said tuned circuit of said intermediate frequency amplifier to decrease the Q of said tuned circuit and thereby reduce the gain of said intermediate frequency amplifier as said conductivity of said second transistor increases.

2. The radio receiving apparatus as defined in claim 1 and wherein said tuned circuit comprises a capacitor and inductor in parallel and the emitter of said second transistor is connected to said inductor whereby the current flowing in said emitter follower output flows through said inductor.

* * * * *